United States Patent
Prucnal et al.

(10) Patent No.: US 8,315,489 B2
(45) Date of Patent: Nov. 20, 2012

(54) OPTICAL SENSOR ARRAY

(76) Inventors: Paul Prucnal, Princeton, NJ (US);
Glenn A. Gladney, Manalapan, NJ (US)

( * ) Notice: Subject to any disclaimer, the term of this patent is extended or adjusted under 35 U.S.C. 154(b) by 335 days.

(21) Appl. No.: 12/818,550

(22) Filed: Jun. 18, 2010

(65) Prior Publication Data

US 2010/0322553 A1 Dec. 23, 2010

Related U.S. Application Data

(60) Provisional application No. 61/218,236, filed on Jun. 18, 2009.

(51) Int. Cl.
*G02B 6/26* (2006.01)
(52) U.S. Cl. ............... 385/17; 385/15; 385/16; 385/18; 385/23
(58) Field of Classification Search .............. 385/15, 385/16, 17, 18, 23
See application file for complete search history.

(56) References Cited

U.S. PATENT DOCUMENTS

| | | |
|---|---|---|
| 3,703,328 A | 11/1972 | Glass et al. |
| 3,799,642 A | 3/1974 | Phillips et al. |
| 3,873,179 A | 3/1975 | Burke |
| 4,012,108 A | 3/1977 | Ishii et al. |
| 4,244,045 A | 1/1981 | Nosu et al. |
| 4,750,153 A | 6/1988 | Owechko et al. |
| 5,132,811 A | 7/1992 | Iwaki et al. |
| 5,357,359 A | 10/1994 | Uchiyama et al. |
| 5,422,873 A | 6/1995 | Kewitsch et al. |
| 5,450,218 A | 9/1995 | Heanue et al. |
| 5,550,779 A | 8/1996 | Burr et al. |
| 5,717,508 A | 2/1998 | Stoll |
| 5,877,875 A | 3/1999 | Reis et al. |
| 5,999,287 A | 12/1999 | Davies et al. |
| 5,999,293 A | 12/1999 | Manning |
| 6,023,352 A | 2/2000 | Haskal |
| 6,026,053 A | 2/2000 | Satorius |
| 6,031,643 A | 2/2000 | Burr |
| 6,061,154 A | 5/2000 | Campbell et al. |
| 6,088,321 A | 7/2000 | Yamaji et al. |
| 6,166,835 A | 12/2000 | Yang |
| 6,256,281 B1 | 7/2001 | Tanaka et al. |
| 6,272,095 B1 | 8/2001 | Liu et al. |
| 6,275,625 B1 | 8/2001 | Bergmann |
| 6,320,683 B1 | 11/2001 | Ito et al. |
| 6,373,806 B1 | 4/2002 | Kitamura et al. |
| 6,424,773 B1 | 7/2002 | Watanabe |
| 6,477,300 B2 | 11/2002 | Watanabe et al. |
| 6,535,472 B1 | 3/2003 | Lee et al. |
| 6,556,531 B1 | 4/2003 | Yagi et al. |
| 6,594,220 B1 | 7/2003 | Matsushita et al. |
| 6,665,480 B2 | 12/2003 | Watanabe |
| 6,686,097 B2 | 2/2004 | Lahrichi |

(Continued)

OTHER PUBLICATIONS

Saleh, B.E.A and Teich, M.C., "Fundamentals of Photonics" 2nd Edition, Wiley, 2007.

(Continued)

*Primary Examiner* — Jennifer Doan
(74) *Attorney, Agent, or Firm* — The Patentwise Group, LLC

(57) ABSTRACT

A switching array is disclosed that has a plurality of vertical cavity surface emitting lasers having phase shifting mirrors. The switching array may be used for providing a device and system that has optical signal processing of sensing, a serialization and protocol interface, that has increased gray scale levels and sensitivities, pixel polarization detection, higher speed, lower power requirements and provides optical or electrical output for holographic optical storage to a bus or network.

20 Claims, 6 Drawing Sheets

U.S. PATENT DOCUMENTS

| | | | |
|---|---|---|---|
| 6,760,524 B2 | 7/2004 | Mukai | |
| 6,810,176 B2 * | 10/2004 | Frick et al. | 385/37 |
| 6,819,845 B2 | 11/2004 | Lee et al. | |
| 6,853,774 B2 | 2/2005 | Watanabe | |
| 6,859,293 B2 | 2/2005 | Klug et al. | |
| 6,906,838 B2 | 6/2005 | Hoen et al. | |
| 6,961,499 B2 | 11/2005 | Lee et al. | |
| 6,987,607 B2 | 1/2006 | Watanabe | |
| 6,999,397 B2 | 2/2006 | Roh et al. | |
| 7,005,669 B1 | 2/2006 | Lee | |
| 7,006,742 B2 | 2/2006 | Takahashi et al. | |
| 7,019,874 B2 | 3/2006 | Park | |
| 7,020,372 B2 | 3/2006 | Lee et al. | |
| 7,072,549 B2 | 7/2006 | Watanabe | |
| 7,076,174 B2 | 7/2006 | Watanabe et al. | |
| 7,095,959 B2 | 8/2006 | LoCascio et al. | |
| 7,149,014 B2 | 12/2006 | Chao et al. | |
| 7,227,674 B2 | 6/2007 | Klug et al. | |
| 7,245,408 B1 | 7/2007 | Huang et al. | |
| 7,251,066 B2 | 7/2007 | Chao et al. | |
| 7,262,892 B1 | 8/2007 | Yasuda et al. | |
| 7,271,940 B2 | 9/2007 | Klug et al. | |
| 7,295,356 B2 | 11/2007 | King | |
| 7,336,413 B2 | 2/2008 | Hasegawa et al. | |
| 7,345,802 B2 * | 3/2008 | Pezeshki et al. | 359/223.1 |
| 7,359,306 B2 | 4/2008 | Matsumoto et al. | |
| 7,423,564 B2 | 9/2008 | Kitayama et al. | |
| 7,507,504 B2 | 3/2009 | Wu et al. | |
| 2006/0239325 A1 | 10/2006 | Johnson et al. | |
| 2008/0304826 A1 | 12/2008 | Sochava | |

OTHER PUBLICATIONS

Milonni, P.W and Eberly, J.H., "Laser Physics", Wiley, 2010.
Connelly, M.J., "Semiconductor Optical Amplifiers", Kluwer, 2004.
Chow, W.W. and Koch, S.W., "Semiconductor-Laser Fundamentals", Springer, 1999.
Thompson, G.B.H., "Physics of Semiconductor Laser Devices", Wiley, 1980.
Sokoloff, J.P., Prucnal, P.R., Glesk, I. and Kane, M., "A Terahertz Optical Assymetric Demultiplexer (TOAD)", IEEE Photonics Technology Letters, 5 (7), p. 787-790, 1993.
Kang, K.I., Glesk, I., Chang, T.G., Prucnal, P.R. and Boncek, R.K., "Demonstration of All-Optical Mach-Zehnder Demultiplexer", Electronics Letters, 31 (9), p. 749-750, 1995.
Kang, K.I., Chang, T.G., Glesk, I. and Prucnal, P.R., "Comparison of Sagnac and Mach-Zehnder Ultrafast All-Optical Interferometric Switches based on a Resonant Optical Nonlinearity", Applied Optics, 35 (3), p. 417-426, 1996.
International Search Report dated Jan. 27, 2011 for corresponding PCT/US2010/039132 filed Jun. 18, 2010.

* cited by examiner

OPTICAL SENSOR ARRAY

This Application claims the benefit of U.S. Provisional Patent No. 61/218,236 filed on Jun. 18, 2009, the contents of which are incorporated by reference.

BACKGROUND OF THE INVENTION

1. Field of the Invention

The present invention is directed towards the field of optical sensor arrays. In particular the present invention is directed towards the field of directly modulated-SLM used in optical sensor arrays.

2. Description of the Related Technology

Gallium arsenide (GaAs) direct bandgap semiconductor material led to the first successful room temperature laser and remains one of the most important types of lasers even today. Its success is largely because it shares nearly the same lattice constant as $Ga_{1-x}Al_xAs$, which serves as a barrier layer for a wide range of x when fabricated into buried heterostructures. Because of both optical and carrier confinement, and because GaAs can be readily p-doped and n-doped, this has made GaAs lasers the most common of all semiconductor lasers. The laser output is centered at 850 nanometer wavelength in the visible red spectral region due to the band gap energy of 4.2 electron volts.

Now turning to Vertical Cavity Surface Emitting Lasers (VCSELs), the fundamental difference between conventional edge-emitting semiconductor laser diodes and VCSELs lies in their geometry. As the name VCSEL implies, it is a device that emits power perpendicularly from its surface. More importantly, VCSEL wafers are fabricated using layer-by-layer deposition methods, followed by chemically-assisted ion beam etching to faun planar arrays of pillar-shaped microlasers. The geometrical arrangement of their end reflectors consists of many alternating high/low refractive index layers effectively making up a pair of Fabry-Perot resonator mirrors. These mirrors can have reflectances >99%, deposited directly on both sides of a multiple QW active region. VCSEL arrays are usually grown using Metal-Organic Chemical Vapour Deposition (MOCVD) techniques by sequentially depositing all of their layers and then etching away all layers down to the substrate, leaving a two-dimensional array of microlasers with diameters generally ranging from 5μ to 10μ. These microlasers generally have only a few active quantum well layers (QWs) and therefore have low gain in their light propagation direction, which requires them to have mirror reflectances of >99%. However, since they have a small mirror separation, usually about 8μ, their single frequency operation is guaranteed. Two engineering problems that must be faced are attachment of metallic electrodes within a dense 2D VCSEL array and removal of heat from the array when the VCSEL microlaser array is operated at a high duty cycle. Usually one electrode is attached to the non-emitting end of each microlaser, but the output laser beam must emit through the opposite face where a second electrode is attached and limits separation distance between each microlaser. Typically, VCSELs have threshold injection current densities of $J_{th}$=5 to 7 $kA/cm^2$, but due to their small size this translates to actual threshold current values of approximately 1 milliampere per microlaser with a typical power output $\leq 0.5$ milliwatt at 850 nm for a GaAs-based device. One important feature of VCSELs is the shape of the output laser beam, which can be controlled to make it highly circular and symmetric about its axis. This obviates the need for external astigmatic type beam correction that is generally necessary in the case of edge-emitting diode lasers. While large 2D arrays may be etched onto a single substrate, the problem of effectively cooling such large arrays remains.

Lasers are typically thought of as devices that emit optical power due to stimulation of radiation as a result of optical gain produced by some type of pumping mechanism. Such devices may be considered as oscillators that generate external optical power in a highly directional beam within a narrow spectral bandwidth. However, all oscillators are amplifiers with feedback. Lasers are optical amplifiers with feedback provided by two or more mirrors. Those lasers having an open Fabry-Perot type resonator oscillate near a well-defined center frequency $v_o$ with adjacent frequencies determined by the mirror spacing L, where such side frequencies are separated by: $\Delta v = c/2L$.

If it is desired that the device discussed above should not oscillate at all, a device may be built similar to a laser that suppresses oscillation by eliminating any feedback. Such a device can remain as strictly an amplifier without feedback. Semiconductor optical amplifiers (SOAs) have all the features of a laser diode type device but it must be ensured make sure they do not oscillate by equipping them with antireflective end face coatings and not exceeding pump input levels where they may tend to self-oscillate. The unsaturated gain coefficient in a SOA active region is given by:

$$\gamma_o(v) = (\lambda^2/8\pi\tau_r)\rho(v)[f_c(E_2) - f_v(E_1)]$$

where: $\tau_r$=radiative recombination time; $\rho(v)$=joint density of states;

$[f_c(E_2)-f_v(E_1)]$=degree of population inversion due to the difference in occupancy factors for electrons in energy level $E_2$ of conduction band versus electrons in energy level $E_1$ of valence band.

When an SOA is pumped by injected current, it behaves as a four-level device, which means the gain coefficient $\gamma_o(v)$ depends upon injected carrier concentration, but in a totally nonlinear way. This makes analysis difficult, but can be treated by considering operation at high gain, where the peak gain $\gamma_p$ varies nearly linearly with injected carrier density. Then it is approximated:

$$\gamma_p(v) \approx \alpha(v)[\Delta n/\Delta n_T - 1]$$

where: $\alpha(v)$=absorption coefficient under zero current injection; $\Delta n$=injected carrier density; $\Delta n_T$=injected carrier density at transparency condition where gain just balances loss. Finally, an expression for overall SOA unsaturated gain for an SOA length L given by:

$$G_o(v) = \exp[(\Gamma\gamma_o(v) - \alpha(v))L]$$

Here Γ is a confinement factor describing the ratio of power flowing in the active device region versus total power flowing through the entire device. Now consider the nonlinear behavior of an SOA device which is chiefly controlled by the injected carrier density Δn. Specifically changes in Δn can induce changes in phase associated with light passing through an SOA device. Conversely, the passage of an optical signal through an SOA can alter the gain by inducing changes in Δn.

The unsaturated gain coefficient denoted above by $\gamma_o(v)$ becomes saturated when power flows through an SOA. Gain media in which homogeneous broadening occurs is considered, and for which gain saturates in the following manner:

$$\gamma(v) = \gamma_o(v)/[1 + 2[(\Phi_v^{(+)} + \Phi_v^{(-)})/\Phi_v^{sat}] \sin^2 kz]$$

where: $\Phi_v^{sat}$ is the saturated photon flux in the z-direction along the device, which is related to the optical intensity by: $I_v = hv\Phi_v$. The above expression allows for spatial hole burning in the gain medium, which may become important when SOA VCSEL type devices are considered.

The devices discussed above may be useful in variety of systems, however to date they have not been used to their fullest potential.

In optical communications, computing, and signal processing applications, there is a need for switching devices and modulators that can exceed the speed of conventional electronics. Therefore there is need for devices, which can switch or modulate an optical signal at speeds far exceeding that of electronics.

Currently devices are charge coupled devices (CCDs) and complementary metal-on-semiconductor (CMOS) devices. The density and speed of access are typically inversely proportional in these devices. These devices have limited individual pixel control (e.g. optical power sensitivity and polarization). These devices require and complex electronics for pixel processing (e.g. sensing, serialization and protocol interfacing).

Therefore, there is need to provide a device and system that provides processing, sensing, serialization, a protocol interface, that has increased gray scale levels and sensitivities, pixel polarization detection, higher speed, lower power requirements and provides optical or electrical output for holographic optical storage to a bus or network.

SUMMARY OF THE INVENTION

An object of the present invention may a method and system for optical switching.

An aspect of the present invention may be an switching array comprising: a substrate; a plurality of vertical cavity surface emitting lasers mounted on the substrate; and a plurality of phase-shifting mirrors located above the vertical cavity surface emitting lasers; and a plurality of beam splitters located above the plurality of vertical cavity surface emitting lasers.

An aspect of the present invention may be a switching array comprising: a substrate; a vertical cavity surface emitting lasers located on the substrate; wherein the vertical cavity surface emitting laser has an output side; wherein the output side is coated with an anti-reflection coating; and a phase shifting mirror located proximate to the output side These and various other advantages and features of novelty that characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

DETAILED DESCRIPTION OF THE PREFERRED EMBODIMENT(S)

In the present invention use is made of controlled gain saturation in an SOA device to create a phase change in an optical signal as it propagates in each direction along its z-axis. In the following expression, the flux forward z-axis direction is denoted by $\Phi_v^{(+)}$ and the flux in the backward direction is denoted by $\Phi_v^{(-)}$:

$$\gamma(v) = \gamma_o(v)/[1 + 2[(\Phi_v^{(+)} + \Phi_v^{(-)})/\Phi_v^{sat}] \sin^2 kz]$$

An appropriate phase change may be created by use of a control beam at a different wavelength than that of the signal beam to drive the SOA device and to hold its phase for a certain specified period of time. However, the control beam will saturate the gain of the SOA in accordance with the following relationship:

$$\ln [G_o(v)/G(v)] = \ln \{[1-(\alpha(v)/\Gamma\gamma_o(v))(1+\Phi_v^{(+)}(z=0)/\Phi_v^{sat})]/[1-(\alpha(v)/\Gamma\gamma_o(v))1+G(v)\Phi_v^{(+)}(z=0)/\Phi_v^{sat})]\}(\alpha(v)/\Gamma\gamma_o(v)).$$

In this expression, photon flux will be due mainly to the control signal with intensity assumed to be stronger than that of the signal beam. The induced phase change due to reduction of gain by the control beam will be imposed on the signal beam. This induced phase change is caused by a change in carrier density, which in turn produces a reduction in dielectric constant. This incremental change in phase (dφ/dz) is governed by the change in refractive index (δn) given by:

$$d\phi/dz = k(\delta n)$$

through the change in dielectric constant (Δ∈) which is related to carrier concentration by:

$$\Delta\in = -(\Delta n e^2 \in_0)/(m_{eff}\omega^2)$$

where: Δn=carrier concentration; $m_{eff}$=effective mass; $\in_0$=free space permittivity e=electron charge; ω=angular light frequency=2πv=2πc/λ. This may be used in combining VCSELs with SOAs.

Figure 1A:
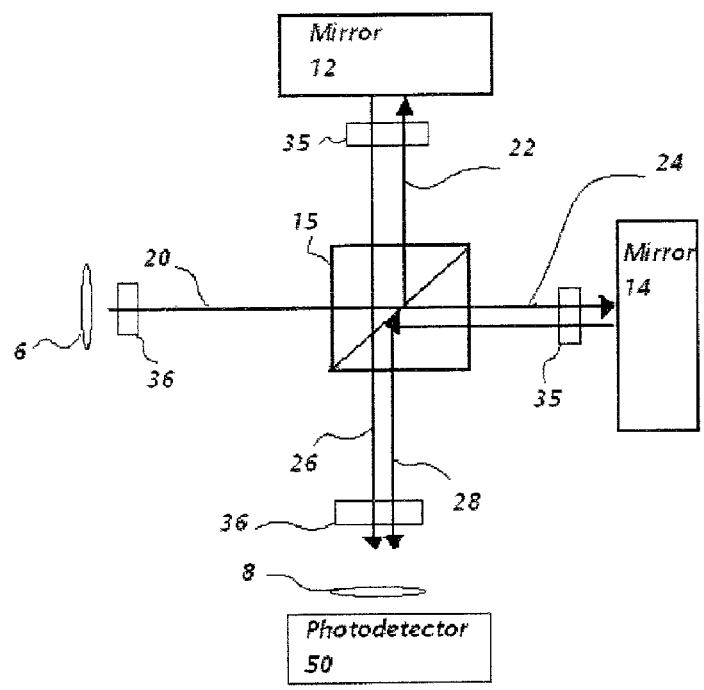
FIG. 1(a) and FIG. 1(b) are diagrams showing an optical switch, made in accordance with an embodiment of the present invention.
Figure 1B:
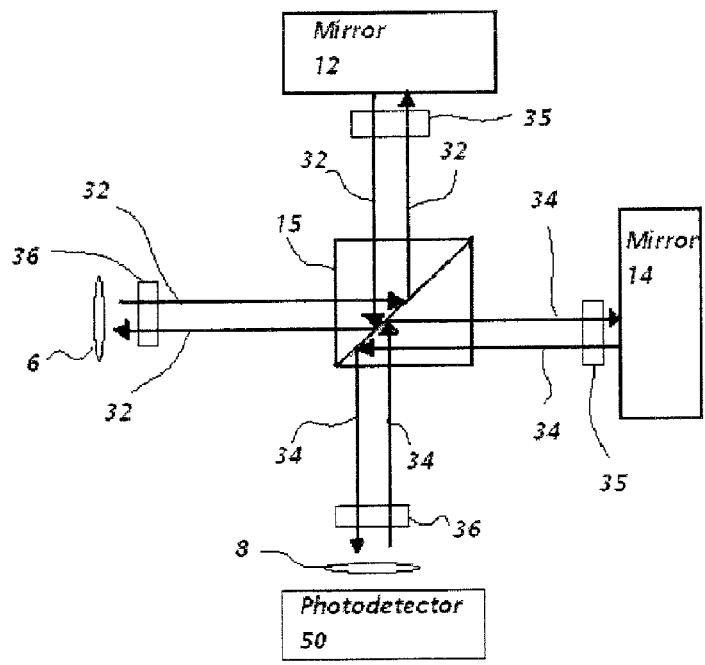

In addressing the need for fast optical switches, an embodiment of the present invention may be a fast optical switch 100 using a Michelson interferometer set up and a differential onset of optical nonlinearity. An embodiment of the optical switch 100 is shown in FIGS. 1(a) and 1(b), the optical switch 100 may also be a Michelson Terahertz Optical Asymmetric Demultiplexer (TOAD). FIG. 1(a) shows the arrangement of the mirrors and path of the first and second input signals 22 and 24 in the optical switch 100. FIG. 1(b) shows the arrangement of the mirrors and path of the first and second control signals 32 and 34.

As shown in FIG. 1(a), the present invention comprises an original input signal 10, which strikes an optical splitting device, which may be a polarization beam-splitter 15. The present invention may further comprise a first mirror 12 and a second mirror 14, which may both be phase-controllable; and first and second output signals 26 and 28. FIG. 1(b) shows the paths taken by the first and second control signals 32 and 34. For clarity, the paths through the optical switch 100 of the optical original input signal 20 and the optical first and second control signals 32 and 34 are shown separately in FIG. 1(a) and FIG. 1(b).

The optical switch 100 may have an input port 6 that receives the original input signal 10 and an output port 8, where the first and second output signals 26 and 28 exit the optical switch 100.

The beam splitter 15 and first and second mirrors 12, 14 are arranged in a Michelson interferometer configuration as shown in FIGS. 1(a) and 1(b). First mirror 12 and second mirror 14 are oriented at right angles with respect to each other. The arrangement of the first mirror 12 and the second mirror 14 is such that the original input signal 20 is split into first and second input signals 22 and 24 and directed to each of the two mirrors 12 and 14, where the first and second input signals 22 and 24 are reflected back toward the beam splitter 15 and to the output.

At the output port 8, the first and second output signals 26 and 28 are incident on a photodetector 50, wherein the combined signal is converted into a photocurrent. At the output port 8, the first and second output signals 26 and 28 interfere with one another in a way that depends on the phase shifts caused by first and second mirrors 12 and 14, as well as the differential path length between the arms of the interferometer. Here the differential path length in the interferometer is configured to result in either constructive or destructive interference of the first and second output signals 26 and 28 at the output port 8.

In one arrangement of the optical switch 100, if the additional relative phase shift between the first and second output signals 26 and 28 produced by the first and second mirrors 12 and 14 is zero, then they will combine constructively, and if the additional relative phase shift between the first and second output signals 26 and 28 caused by the first and second mirrors 12 and 14 is at 180°, then they will combine destructively. In another arrangement of the optical switch 100, if the additional relative phase shift between the first and second output signals 26 and 28 caused by the by first and second mirrors 12 and 14 is at zero, then they will combine destructively, and if the additional relative phase shift between the first and second output signals 26 and 28 caused by first and second the mirrors is 180°, then they will combine constructively. In any case, when two signals at the same frequency travel in the same direction as plane waves, where one signal is delayed by an optical path difference d with respect to the other and are then recombined, the total intensity is determined by the following relationship:

$$I_{total} = I_1 + I_2 + 2\sqrt{(I_1 I_2)} \cos(|\phi_2 - \phi_1|)$$

where the relative phase difference $|\phi_2-\phi_1|=(2\pi/\lambda)(|d_2-d_1|)$ and where d is the optical path length defined by: $d=\int n\, ds$ integrated over a given path. When the optical path length difference $|d_2-d_1|$ is an integer multiple of the wavelength $\lambda$, complete constructive interference occurs for a pair of beams having equal initial intensity $I_1=I_2$, but when the optical path length difference $|d_2-d_1|$ is an odd integer multiple of $\lambda/2$, complete destructive interference occurs. If the initial beams have unequal intensity, less than complete interference occurs, as governed by the above relationship. In all cases, whether or not the relative phase shift $|\phi_2-\phi_1|$ results in a destructive or constructive combination of the first and second output signals 26 and 28 is the result of the optical path length difference $|d_2-d_1|$.

The first and second mirrors 12 and 14 may be comprised of a nonlinear optical material, which is capable of changing the phase of light reflected from mirrors depending on the intensity of an optical control. For example, the mirrors may include a medium having a strong optical Kerr effect such as doped glass, and a back reflector, or a medium having optical gain such as an SOA with a back reflector, such as SOA 40 with a back reflector. The back reflector may consist of a cleaved facet on the back surface of each SOA 40, or alternatively a separate mirror. However, if such a separate mirror is used, an abrupt phase jump equal to $\pi$ radians occurs upon reflection, which must be taken into account with respect to determining overall device behavior.

As known by those of ordinary skill in the art, when an SOA, such as SOA 40 is biased with a constant external current of appropriate value, then an amplifier can produce optical gain. Injecting a strong optical pulse into the SOA 40 can cause depletion of the gain, which is accompanied by a change in index of refraction in the SOA 40, resulting in a phase shift to light passing through the amplifier. The onset of the change in the index of refraction in the SOA 40 can closely follow the rising edge of the input optical pulse for rise-times as short as about one picosecond. Therefore, the injection of a short optical pulse into the SOA 40 will cause a nearly instantaneous phase shift of light passing through an amplifier. The phase shift follows the falling edge of the incident optical pulse when returning to its original value, but follows the recovery of the gain of the SOA 40 instead. This may typically occur over a time period of 25 to 200 picoseconds. Therefore, in response to a short control pulse, the resulting phase shift will have a fast, nearly instantaneous (picosecond) onset, followed by a much slower (tens to hundreds of picoseconds) recovery to the original value of the phase. Though nonlinear optical material based on SOAs is described here, other nonlinear materials known to those of ordinary skill may also be used.

In the present invention, first and second control signals 32 and 34 are short optical pulses which are individually directed by the beam-splitter 15 to first and second mirrors 12 and 14, as illustrated in FIG. 1(b). The intensities of the first and second control signals 32 and 34 are selected so that they each cause a 180° phase shift in the first and second output signals 26 and 28 with respect to the phase of the first and second input signals 22 and 24. As described above, the fast phase shift caused by the first and second control pulses 32 and 34 is followed by a much slower recovery to the original phase. First and second control signals 32 and 34 are delayed in time with respect to each other by an interval Dt, so that a 180° phase shift is first caused by first control signal 32 to first output signal 26, and then at a time Dt later another 180° phase shift is caused by the second control signal 34 to second output signal 28.

In the embodiment of the interferometer optical switch 100, shown in FIGS. 1(a) and 1(b), when first and second input signals 22 and 24 are recombined at the output port 8, they initially have no relative phase shift, resulting in constructive interference. When first control signal 32 is incident on mirror 12, first and second input signals 22 and 24 have a 180° relative phase shift, resulting in destructive interference. Then, at a time Dt later when the second control pulse 34 is incident on mirror 14, first and second input signal 22 and 24 have a 360° relative phase shift, resulting again in constructive interference.

In a second arrangement, by making a small adjustment to the differential path lengths in the interferometer arms, the phase condition can be changed so that the normal condition at the output port 8 is destructive interference, and constructive interference occurs only when the control signal produces an additional 180° phase shift. In this case, first and second input signals 22 and 24 are recombined at the output port 8 and they initially have no additional relative phase shift, resulting in destructive interference. When first control signal 32 is incident on first mirror 12 the first and second input signals 22 and 24 have an additional 180° relative phase shift, resulting in constructive interference. Then, at a time Dt later when second control signal 34 is incident on second mirror 14 and first and second input signals 22 and 24 have an additional 360° relative phase shift, this results again in destructive interference.

For example, in the second arrangement of the optical switch 100 described above, using first and second control signals 32 and 34 separated in time by a short time interval Dt, a corresponding short segment of the original input signal 20 of duration Dt can be switched to the output port 8. The minimum size of the time interval Dt is limited only by the precision in timing the first and second control signals 32 and 34, and by the minimum duration of the rise time of the control pulses. Intervals as short as approximately one picosecond are possible to obtain with existing technology.

The reflection and transmission characteristics of the beam-splitter 15, and wavelength and polarization of the original input signal 20 and the first and second control signals 32 and 34, are chosen so that they will follow the paths shown in FIGS. 1(*a*) and 1(*b*). For example, if beam-splitter 15 is a polarization beam-splitter (PBS), then original input signal 20 may be launched at 45° linear polarization. Beam splitter 15 could then reflect the vertical polarization component of original input signal 20 toward the first mirror 12 and pass the horizontal component of original input signal 20 toward the second mirror 14. An optional Faraday rotator 35 may be inserted before each mirror, and after a round trip through the Faraday rotator 35, first input signal 20 is rotated 90° to a horizontal polarization, which then passes through the beam splitter 15 to the output port, 8 and second input signal 24 is rotated 90° to a vertical polarization, which is reflected from the beam splitter 15 toward the output port 8. In this arrangement, the first control signal 32 has a vertical polarization, and is reflected by the polarization beam splitter 15 toward first mirror 12 and then back toward the input port 6 on its return path, where it may be blocked by a polarization filter 36. Similarly, the second control signal 34 also has a vertical polarization, and is reflected by the beam splitter 15 toward second mirror 14 and then back toward the output port 8 on its return path, where it may be blocked by a filter 36, which is a polarization filter.

Alternatively, rather than using polarization filters 36, the angle of the first and second control signals 32 and 34 may be chosen so that upon their return they do not spatially overlap with the original input signal 20 at the input port 6, or the first and second input signals 22 and 24 at the output port 8, and can be blocked by spatial filters.

As another alternative, the routing of the first and second input signals 22 and 24 and first and second control signals 32 and 34 can be accomplished by choosing their wavelengths appropriately and using a wavelength-selective beam-splitter 15 and a filter 36 that is a wavelength filter.

This Michelson interferometer described above can be implemented in a variety of ways commonly known to those skilled in the art, including discrete optical components such as a polarization beam splitter 15 and semiconductor optical amplifiers, and lenses for collimating the optical beams as well as for coupling the beams to the active region of the SOAs 40. As described above, the back reflector 42 following each SOA 40 could consist of a cleaved facet on the back surface of the SOA 40, or a separate mirror. Alternatively, the interferometer can also be implemented with fiber optics, including a 2×2 polarization coupler, and fiber-coupled SOAs, though this configuration needs to be stabilized and controlled to avoid random phase fluctuations caused environmental effects on the fibers.

Figure 2:
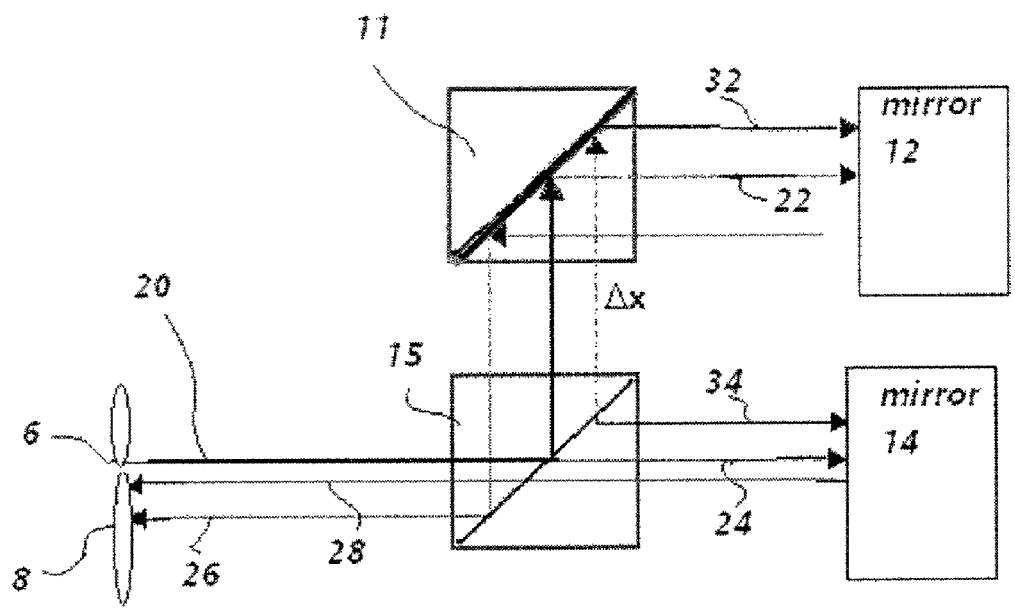
FIG. 2 is diagram showing an optical switch, made in accordance with another embodiment of the present invention.

Another embodiment of the Michelson interferometer is shown in FIG. 2. In the embodiment shown in FIG. 2 the second optical switch 200, which may be used as a Michelson Terahertz Optical Asymmetric Demultiplexer (TOAD), comprises a beam-splitter 15, and first ordinary mirror 11 and second ordinary mirror 13, the first and second ordinary mirrors 11 and 13 are ordinary mirrors which are reflecting on both sides. The original input signal 20 follows the path shown, being split by beam-splitter 15 into first and second input signals 22 and 24 which are reflected from the phase-shifting first and second mirrors 12 and 14. On the return path, the phase shifted first and second input signals 22 and 24 are again split by beam-splitter 15 into first and second output signals 26 and 28. The differential path length in the interferometer is configured to result in either constructive or destructive interference of the first and second output signals 26 and 28 at the output in the same manner as discussed above.

The additional phase shift caused by the first and second control pulses 32 and 34 results in a segment of the original input signal 20 being switched to the output port 8, also in the same manner as described above. The duration Dt of the original input signal 20 switched to the output port is equal to the time difference of arrival Dt of the first and second control pulses 32 and 34 at the phase-shifting first and second mirrors 12 and 14, respectively. The time difference of arrival Dt corresponds to the additional time-of-flight of the first control signal 32 as it traverses the distance Dx, represented by the dashed portion of the path shown in FIG. 2 between the beam-splitter 15 and the first ordinary mirror 11. Therefore, the duration of the switching window Dt is determined by the distance Dx and the index of refraction along the dashed path, as is well-know to those of ordinary skill in the art. Intervals as short as approximately one picosecond are possible to obtain with existing technology.

The optical switch 200 shown in FIG. 2 may also be implemented on an integrated substrate 70 using SOAs 40 based on vertical cavity surface emitting lasers (VCSELs) 55 with their top mirrors replaced by antireflection coatings, and the routing optics implemented with planar optical circuits above the SOAs 40. Technology that could be used for the planar routing circuits could, for example, be holographic elements, MEMs technology or silicon optical bench technology. The use of integrated technology would enable fabrication of this system in large arrays based on arrays of VCSELs 55.

Implementations of the optical switches 100 and 200, and the components of the phase-shifting first and second mirrors 12 and 14 are shown in FIGS. 3-7. The optical switches 100 and 200 may be formed using directly modulated spatial light modulators (DMSLM) formed using SOAs 40. These are distinguished by utilizing cross-phase modulation (XPM) between the control B signals that introduce depletion of the saturated gain in the SOAs which introduces the phase modulation to switch the A signals described earlier above.

Figure 3:
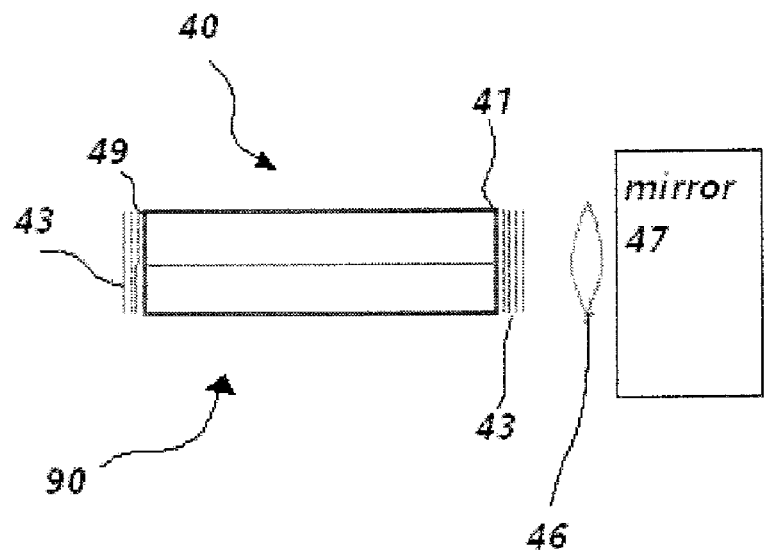
FIG. 3 shows a semiconductor optical amplifier (SOA) made in accordance with an embodiment of the present invention.

In FIG. 3 a DMSLM 90 is shown. The DMSLM 90 may comprise the SOA 40, a lens 46 and a mirror 47. In this configuration, a vertical cavity SOA (VCSOA) is used, as described earlier where it comprises a VCSEL type device with its end mirrors chosen to be antireflective such that it cannot oscillate and is therefore a multiple quantum well (MQW) type amplifier. The choice of active gain medium will determine the operating wavelength range of the VCSOA as noted earlier. Typical preferred materials are GaAs/AlGaAs operating at a central wavelength near 850 nm, or InGaAsP/InP operating over a wavelength range centered near 1550 nm. In FIG. 3, the output of the SOA 40 on first facet 41 is collimated by a lens 46 and reflected back into the SOA 40 by the mirror 47. The SOA 40 may have anti-reflection coatings 43 on its first facet 41 so as to reduce the reflectivity. The anti-reflection coating 43 may be made from a multi-layer dielectric stack and in FIG. 3 is located on the first facet 41 and second facet 49 of the SOA 40.

Figure 4:
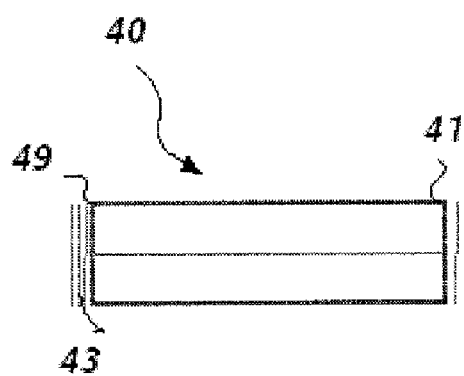
FIG. 4 shows a semiconductor optical amplifier (SOA) made in accordance with another embodiment of the present invention.

Alternatively, as shown in FIG. 4, the DMSLM 90 may comprise an SOA 40 with an anti-reflection coating 43 on the second facet 49 and no anti-reflection coating on the first facet 41. In this embodiment, the first facet 41 may comprise a cleaved facet of the type commonly used to form the mirrors of laser diodes.

Figure 5:
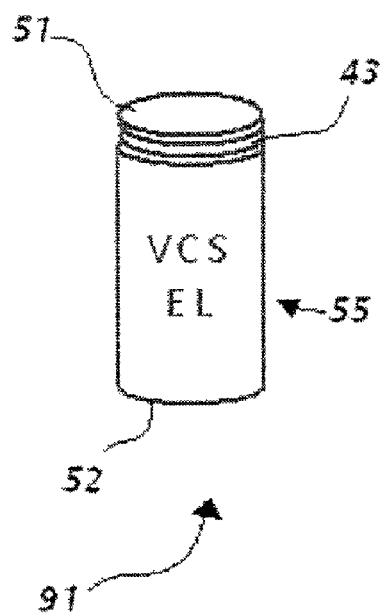
FIG. 5 shows a VCSEL made in accordance with an embodiment of the present invention.

As shown in FIG. 5, another alternative for the formation of spatial light modulator is shown. The DMSLM 91, a vertical-cavity surface emitting laser VCSEL 55 may be modified to implement a phase-shifting mirror, as illustrated in FIG. 5. Here, an ordinary VCSEL 55 is modified by forming an anti-reflection coating 43 on its output face 51, which is the upper face shown FIG. 6. In this configuration, the modified VCSEL 55 has a phase-shifting mirror, such as first mirror 12 or second mirror 14, shown in FIGS. 1(a), 1(b) and 2 on its opposite face 52. The top surface of the output end face 51 may have an anti-reflection coating 43, with reflectance of much less than 0.01 percent or so to prevent any SOA 40 oscillation.

The DMSLMs 90, 91 when used in a holographic storage device require no flat-top generator. The further have the ability to provide a broader range of pixel intensity control, such as gray scale. Pixel control of optical signal power is also provided. The DMSLMs 90, 91 have the ability to change polarization on individual pixels within a page of a holographic storage medium. Furthermore, the DMSLMs 90, 91 are a solid state devices with no moving parts and can enable optical signal input for holographic storage from a bus or network.

Figure 6:
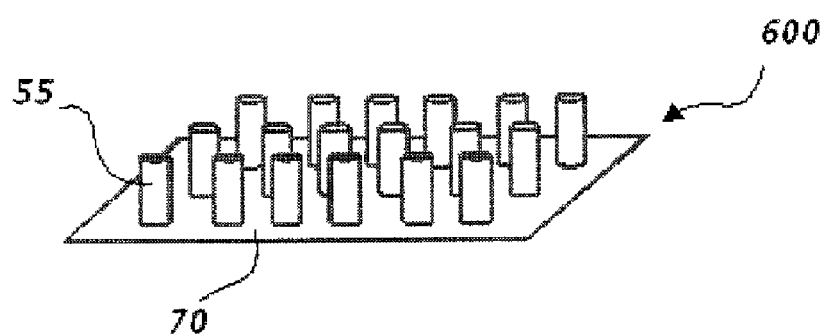
FIG. 6 shows a switching array made in accordance with an embodiment of the present invention.
Figure 7:
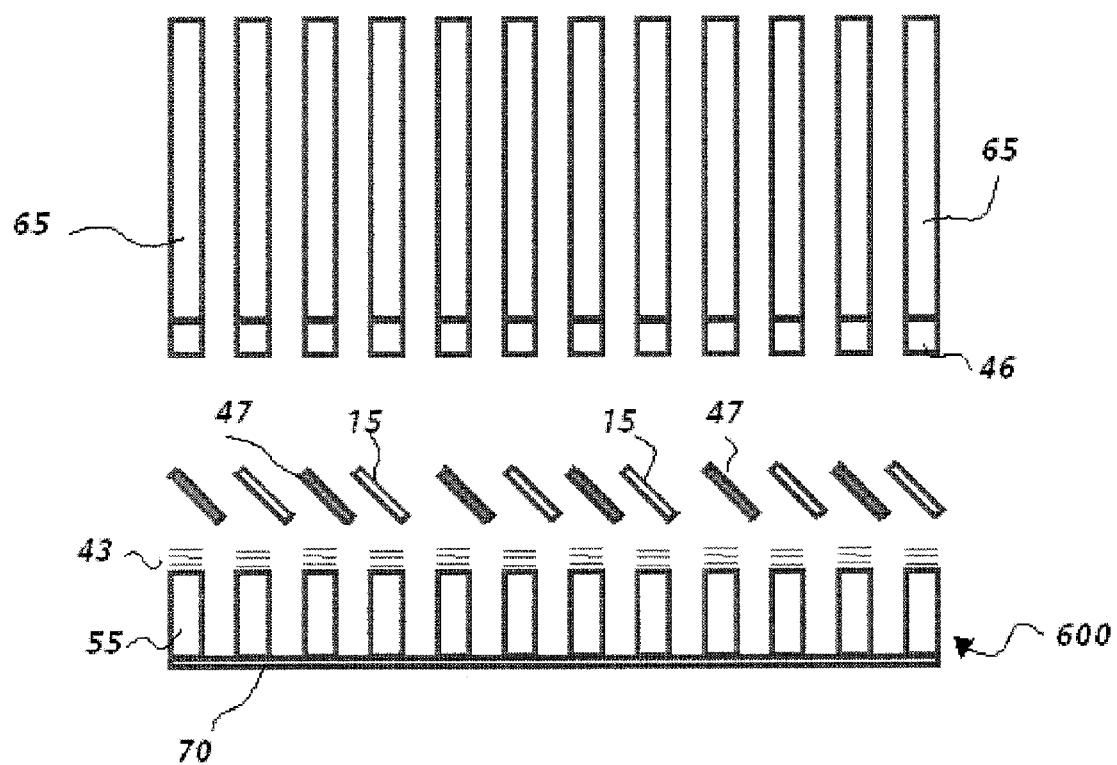
FIG. 7 shows a side view of a two-dimensional switching array implementing VCSELs.

An advantage of the modified VCSEL technology is that it may be made in two-dimensional switching arrays 600 as illustrated in FIG. 6 by using well-known fabrication techniques. The side view of a two-dimensional switching array 600 based on modified VCSELs is shown in FIG. 7. At the bottom of the switching array 600 is a substrate 70 supporting an array of modified VCSELs 55 arranged side-by-side with anti-reflection coatings 43 on their output sides 51. Positioned above the VCSELs 55 are alternating double-sided mirrors 47 and beam-splitters 15, angled appropriately to couple light between optical fibers 65 located above and the modified VCSELs 55 located below. The array of mirrors 47 and beam-splitters 15 may be made, for example, using planar holographic optical elements, MEMs technology or silicon optical bench technology. Collimating lenses 46 may be located between the optical fibers 65 and the mirrors 47 or beam-splitters 15. The path of the signal and control, operation of the phase shifting mirrors 47 (modified VCSELs in this case) and switching operation are the same as with reference to the single device described with respect to the optical switching devices 100 and 200 shown in FIGS. 1 and 2 and discussed above.

The switching array 200 may be used for providing a device and system that has optical signal processing of sensing, a serialization and protocol interface, has increased gray scale levels and sensitivities, pixel polarization detection, higher speed, lower power requirements and provides optical or electrical output for holographic optical storage to a bus or network.

Figure 8:
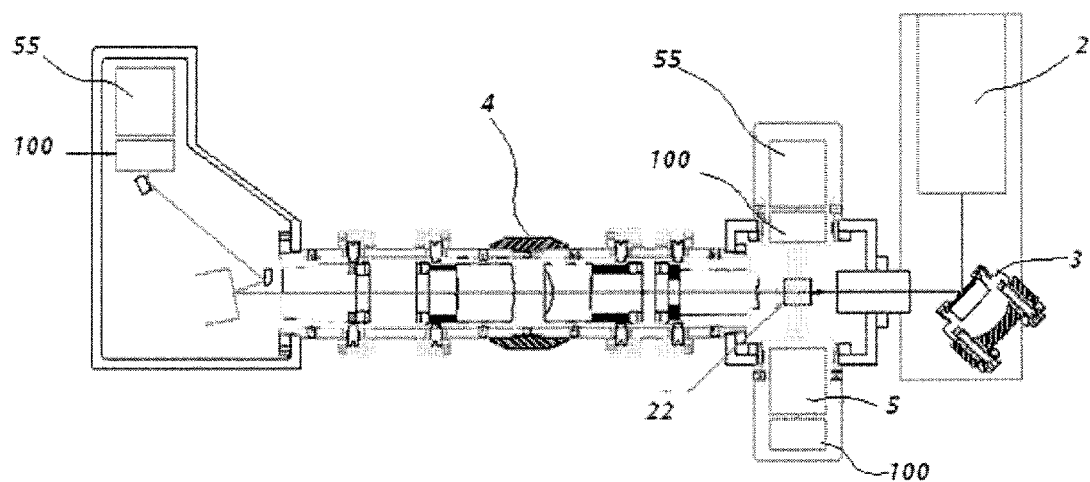
FIG. 8 is schematic showing the implementation an optical switch in a holographic system.

FIG. 8 is schematic showing the usage of the optical switch in a holographic system 300. The holographic system 300 comprises VCSELs 55 located proximate to the optical switches 100, which in the schematic are terahertz optical asymmetric demultiplexers (TOADs). Placement of the TOAD arrays is shown in FIG. 8, where they perform two separate functions. The TOAD arrays 100, shown just below the VCSEL array 55 provide shuttering and phase change if necessary. The TOAD arrays 100 shown beneath the VCSOA array 5 perform signal processing after reception by the VCSOA array 5 to eliminate scatter or incoherent noise and may perform grayscale signal processing. The holographic system 300, further comprises a VCSOA array 5, a photorefractive crystal 22, a beam steering device 4, a bulk erase laser 2 and a plane mirror 3. Beam steering device 4 is used to steer a beam into the photorefractive crystal 22 at 90°. The plane mirror 3 is used to redirect beams at 90° and in this instance to direct the beam from the bulk erase laser 2 into the photorefractive crystal 22.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A switching array comprising:
a substrate; a plurality of vertical cavity surface emitting lasers mounted on the substrate; and a plurality of phase-shifting mirrors located above the vertical cavity surface emitting lasers; and a plurality of beam splitters located above the plurality of vertical cavity surface emitting lasers.

2. The switching array of claim 1, wherein each of the plurality of vertical cavity surface emitting lasers has an output side located distally from the substrate.

3. The switching array of claim 2, wherein the output side is coated with anti-reflection coatings.

4. The switching array of claim 1, wherein each of the plurality of phase-shifting mirrors are double-sided.

5. The switching array of claim 1, wherein the plurality of phase-shifting mirrors and the beam splitters are alternating.

6. The switching array of claim 1, further comprising a plurality of lenses located proximate to phase shifting mirrors.

7. The switching array of claim 1, further comprising a plurality of lenses located proximate to the beam splitters.

8. The switching array of claim 1, further comprising optical fibers located above the plurality of phase-shifting mirrors and beam splitters.

9. The switching array of claim 1, further comprising a plurality of lenses located proximate to the optical fibers.

10. The switching array of claim 1, wherein the anti-reflection coating is made from a multi-layer dielectric stack.

11. A switching array comprising: a substrate; a vertical cavity surface emitting laser located on the substrate; wherein the vertical cavity surface emitting laser has an output side; wherein the output side is coated with an anti-reflection coating; and
a phase shifting mirror located proximate to the output side.

12. The switching array of claim 11, wherein there is more than one vertical cavity surface emitting laser.

13. The switching array of claim 11, further comprising a beam splitter located above the vertical cavity surface emitting laser.

14. The switching array of claim 12, wherein there is more than one phase-shifting mirrors and more than one beam splitter.

15. The switching array of claim 13, wherein the beam splitter is located proximate to the phase-shifting mirror.

16. The switching array of claim 11, wherein the output side is located distally from the substrate.

17. The switching array of claim 11, wherein the phase-shifting mirror is double-sided.

18. The switching array of claim 1, further comprising a lens located proximate to the phase shifting mirror.

19. The switching array of claim 1, further comprising a beam splitter and a lens located proximate to the beam splitter.

20. The switching array of claim 1, further comprising an optical fiber located above the phase-shifting mirror.

* * * * *